(12) United States Patent
Keskin

(10) Patent No.: US 7,161,512 B1
(45) Date of Patent: Jan. 9, 2007

(54) GAIN ERROR CORRECTION IN AN ANALOG-TO-DIGITAL CONVERTER

(75) Inventor: Mustafa Keskin, San Diego, CA (US)

(73) Assignee: Qualcomm Inc., San Diego ( * ) Notice: Subject to any disclaimer, the term of this patent is extended or adjusted under 35 U.S.C. 154(b) by 0 days.

(21) Appl. No.: 11/217,154

(22) Filed: Aug. 31, 2005

Related U.S. Application Data

(60) Provisional application No. 60/691,964, filed on Jun. 16, 2005.

(51) Int. Cl.
*H03M 1/12* (2006.01)

(52) U.S. Cl. ...................... 341/118; 341/172

(58) Field of Classification Search .......... 341/118, 341/150, 172
See application file for complete search history.

(56) References Cited

U.S. PATENT DOCUMENTS

| | | | |
|---|---|---|---|
| 5,012,247 A * | 4/1991 | Dillman | 341/172 |
| 5,134,401 A | 7/1992 | McCartney et al. | |
| 5,852,415 A * | 12/1998 | Cotter et al. | 341/120 |
| 6,304,208 B1 * | 10/2001 | Nagashima | 341/172 |
| 6,433,712 B1 * | 8/2002 | Ohnhaeuser et al. | 341/118 |
| 6,720,903 B1 * | 4/2004 | Confalonieri et al. | 341/172 |
| 6,870,496 B1 * | 3/2005 | Krymski et al. | 341/172 |
| 2003/0063026 A1 * | 4/2003 | Nandy | 341/172 |
| 2005/0123072 A1 | 6/2005 | Guimaraes | |

* cited by examiner

*Primary Examiner*—Howard L. Williams
(74) *Attorney, Agent, or Firm*—Philip R. Wadsworth; Charles D. Brown; Timothy F. Loomis

(57) ABSTRACT

An error correction circuit for use with an analog-to-digital converter (ADC) comprising correction capacitance switching means coupled to the correction capacitance means. The switching means being coupled to ground and to a plurality of reference voltages and being arranged to a couple a bottom plate of the correction capacitance means to ground during a sample phase of the ADC and to one of a plurality of reference voltages during a hold phase of the ADC.

6 Claims, 4 Drawing Sheets

GAIN ERROR CORRECTION IN AN ANALOG-TO-DIGITAL CONVERTER

RELATED APPLICATIONS

This application claims the benefit of U.S. Provisional Application No. 60/691,964 filed Jun. 16, 2005 and is related to application: "GAIN ERROR CORRECTION," U.S. patent application Ser. No. 11/217,155; and application: "OFFSET ERROR CORRECTION," U.S. patent application Ser. No. 11/217,156; filed concurrently herewith.

BACKGROUND

I. Field

The present disclosure generally relates to gain error correction. More particularly, the disclosure relates to gain error correction in a discrete time circuit, such as an Analog-to-Digital converter (ADC).

II. Description of Related Art

Normally, in any ADCs, there is a systematic offset error at zero-code and a systematic gain error at full-scale-code. Since these errors are systematic, they can be calibrated after the first round of testing before mass-production of the ADCs.

Such errors have in the past been corrected through use of a look-up table including correction codes or through the use of correlated double-sampling. These methods involve more circuitry and demand more power. With ADC's being utilized in smaller, battery-powered environments, such as a wireless phone, PDA or laptop computer, minimization of circuitry and power conservation to preserve battery life is more important.

Accordingly it would be advantageous to provide an improved system for correcting offset errors.

SUMMARY

In a particular embodiment, a system and method of correcting gain error can include shifting bottom plate voltage of capacitors.

In one particular embodiment, an error correction circuit for use with an analog-to-digital converter is provided comprising correction capacitance means and switching means coupled to the correction capacitance means. The switching means being coupled to ground and to a plurality of reference voltages and being arranged to couple a bottom plate of the correction capacitance means to ground during a sample phase of the ADC and to one of a plurality of reference voltages during a hold phase of the ADC An advantage of one or more embodiments disclosed herein can include effective gain error correction without high power consumption.

Other aspects, advantages, and features of the present disclosure will become apparent after review of the entire application, including the following sections: Brief Description of the Drawings, Detailed Description, and the Claims.

BRIEF DESCRIPTION OF THE DRAWINGS

The aspects and the attendant advantages of the embodiments described herein will become more readily apparent by reference to the following detailed description when taken in conjunction with the accompanying drawings wherein.

DETAILED DESCRIPTION

Figure 1:
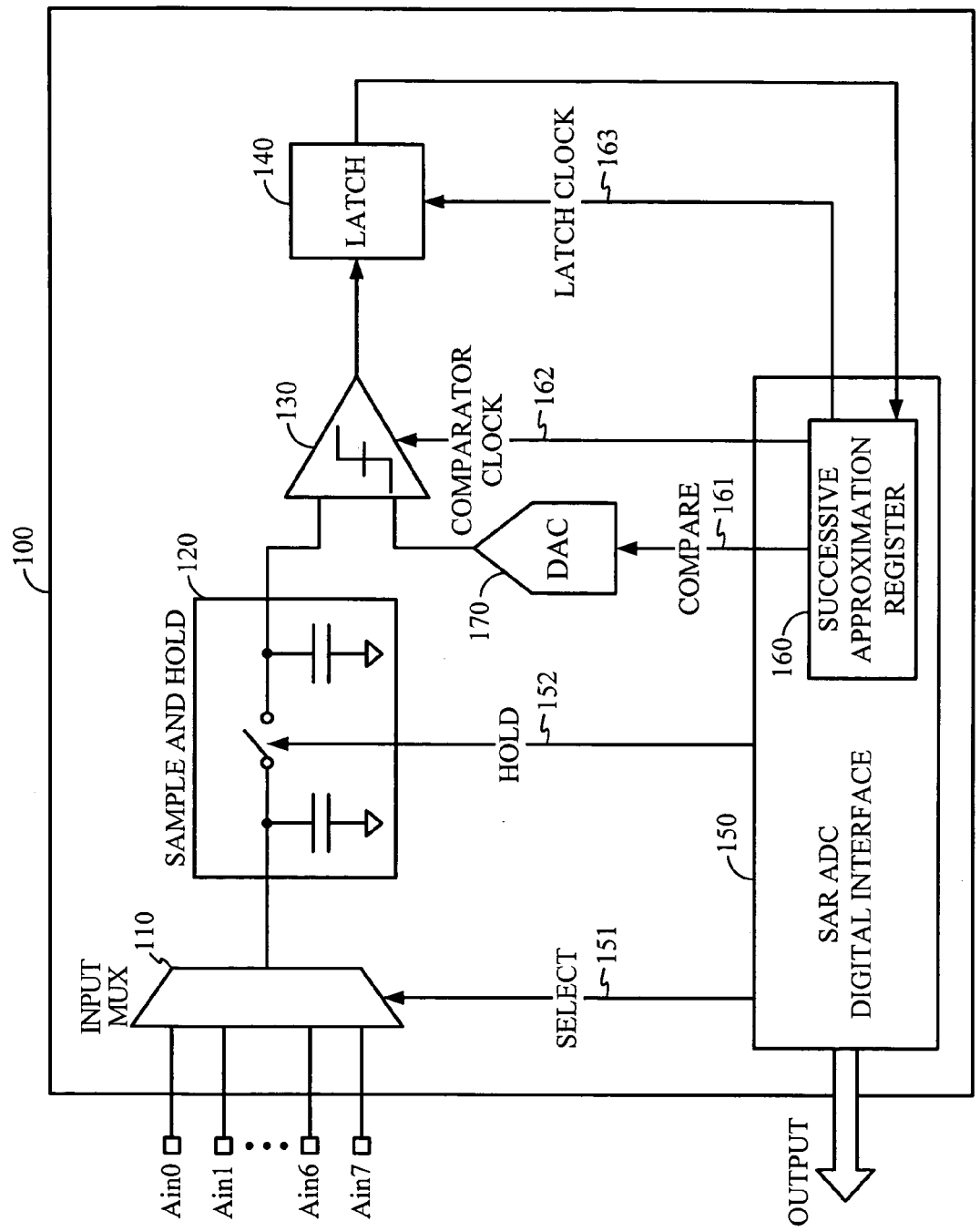
FIG. 1 is a general diagram of an exemplary Successive-Approximation-Register ADC (SAR-ADC) of the prior art.

FIG. 1 shows an SAR-ADC 100 of the prior art. ADC 100 samples the analog input signal through the input mux 110 onto a sample-and-hold circuit 120. Then a comparison is done between reference voltages (from the Digital-to-Analog converter (DAC) 170) and the sampled input signal by comparator 130. The output of comparator 130 is passed onto latch 140 which provides a latched signal to successive approximation register 160 which may be a part of digital interface 150. Digital interface 150 outputs the resulting digital bit. Based on the comparison result of comparator 130, a new reference voltage is created by the DAC 170 and second-comparison is done to generate a second bit. This operation continues until all of the desired bits are obtained. Digital interface 150 controls this operation by providing a select signal 151 to input mux 110 and a hold signal 152 to sample-and-hold circuit 120. Digital interface 150 also may comprise a successive approximation register 160 that generates a compare signal 161, a comparator clock 162 and a latch clock 163. Compare signal 161 is fed to DAC 170 (for providing the reference voltages to comparator 130). Comparator clock 162 is used to time comparator 130 and latch clock 163 is used to time latch 140.

Figure 2:
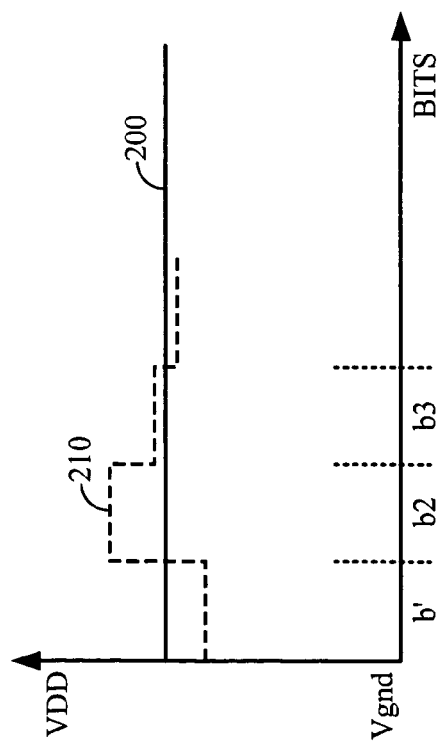
FIG. 2 is a diagram illustrating an exemplary operation of an SAR-ADC of the prior art.

The input voltage and reference voltage generated by the SAR-ADC of FIG. 1 is shown in FIG. 2. The sampled input voltage is represented by solid line 200, while the dashed line 210 represents the reference voltages. As shown in FIG. 2, bits are extracted from the SAR-ADC of FIG. 1 in the order starting from Most-Significant-Bit to Least-Significant-Bit until all the bits are obtained. As represented in this graph, VDD is the full-scale voltage and Vgnd is the zero-scale voltage.

Referring back to FIG. 1, there are various elements that can directly contribute to the offset and gain error, such as (comparator 130, DAC 170, and sample-and-hold circuit 120). The root-causes of the errors can be categorized as mismatches on the comparator 130, charge-injection of the sample-and-hold circuit 120 switches, reference-coupling from DAC 170 to sample-and-hold circuit 120 (kickback noise), and parasitic-elements on DAC 170. These errors are systematic and can be calibrated after system-characterization.

Figure 3:
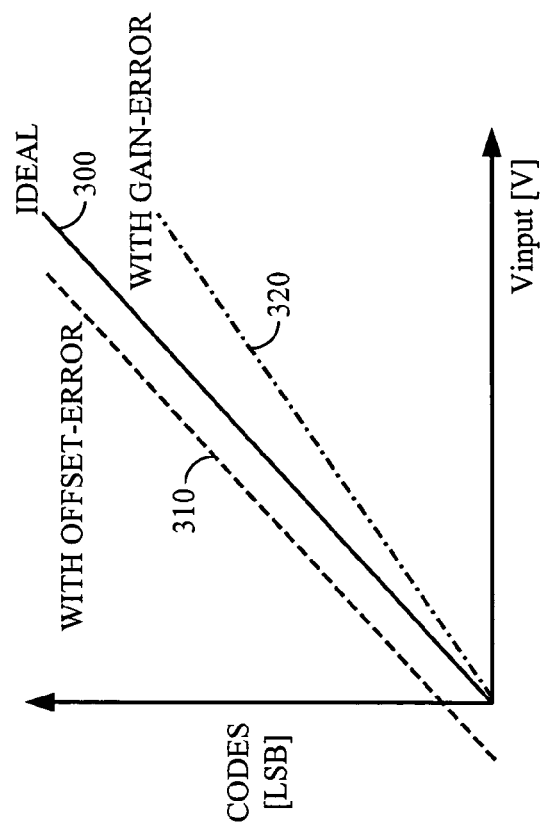
FIG. 3 is a diagram depicting exemplary offset error and gain error introduced by an SAR-ADC of the prior art.

A graph depicting an example of the effects of offset and gain errors on the converted code is represented in FIG. 3. As can be seen, line 300 represents the ideal output of the ADC where the converted code matches the input signal. Offset error causes the ideal line to shift, represented by line 310. Gain error causes a change in the slope of the line as represented by line 320. One or both of these types of errors can exist.

Figure 4:
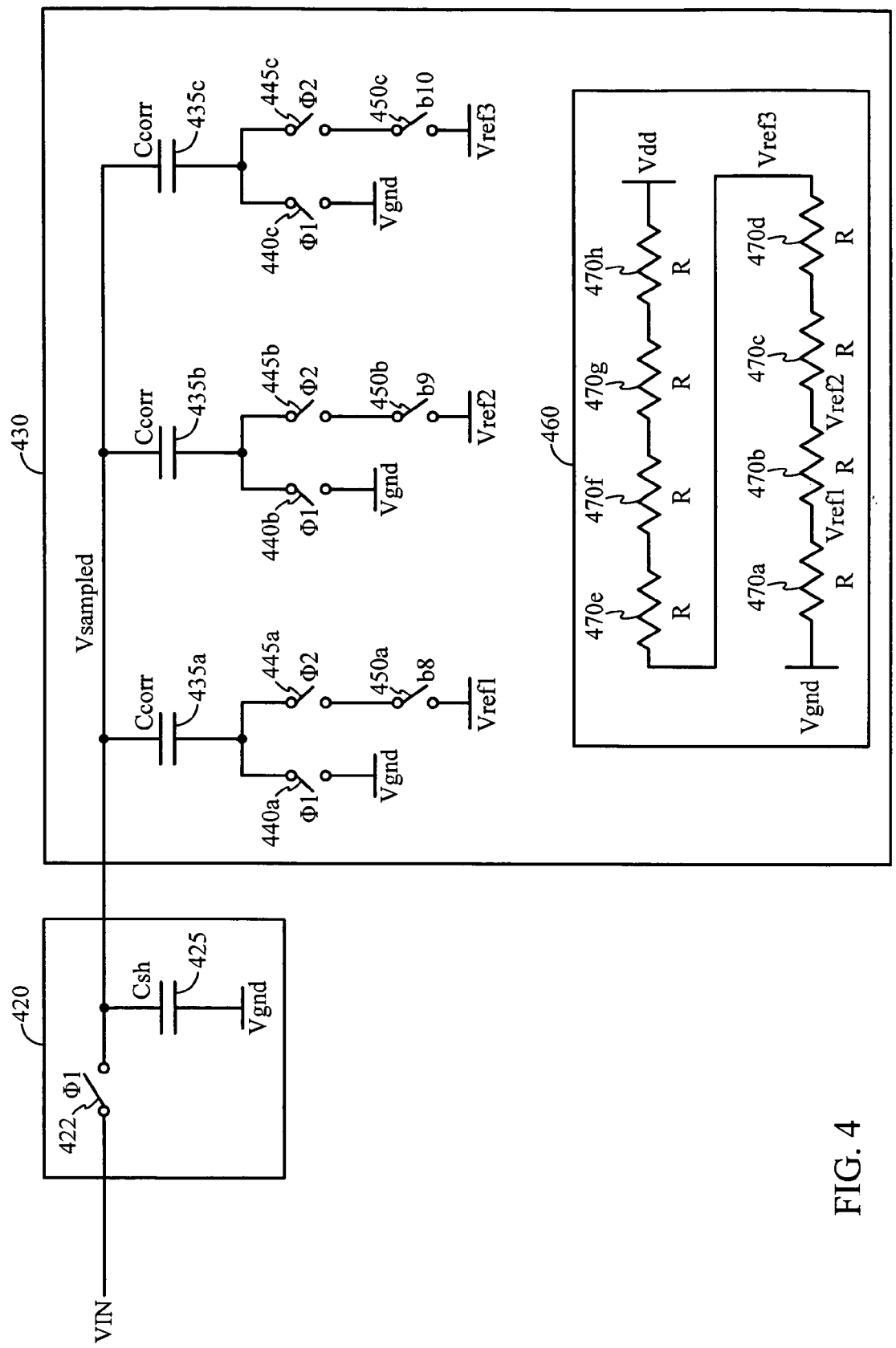
FIG. 4 is diagram illustrating an exemplary embodiment of a gain error correction circuit.

Referring now to FIG. 4, an exemplary embodiment of a gain error correction circuit 430 is shown. The gain error correction circuit 430 of FIG. 4 shifts the bottom-plate voltages of some capacitors to provide gain error correction.

Sample-and-hold circuit 420 comprises sample-and-hold phase switch 422 and sample-and-hold capacitor 425 (Csh). Other components of sample-and-hold circuit 420 are not shown. The output of sample-and-hold circuit 420 is fed to error correction circuit 430. Sample-and-hold switch 422, which may be a CMOS switch for example, controls the sampling operation. Basically, when Φ1 is active high, sample-and-hold phase switch 422 is active (closed) and input signal is passed to the top plate of sample-and-hold capacitor 425 and correction capacitor 435 of error correction circuit 430. When phase switch 422 is opened, the sampling operation is completed and the hold operation starts. Sample-and-hold capacitor 425 may be comprised of a plurality of unit-sized capacitors (Cu), for instance, two hundred Cu's.

Gain error correction circuit 430 comprises a plurality of correction capacitors 435a–c (Ccorr), e.g. The lower plate of each of these correction capacitors 435a–c is electrically coupled to a corresponding arrangement of a first switch 440a–c coupled to ground and a series arrangement of a second switch 445a–c coupled to a third switch 450a–c. Each of the third switches 450a–c is in turn coupled to resistor network 460 at different points so as to provide different reference voltages. For example, third switch 450a may be coupled between resistors 470a and 470b to provide a first reference voltage, Vref1. Third switch 450b may be coupled between resistors 470b and 470c to provide a second reference voltage, Vref2. Likewise, third switch 450c may be coupled between resistors 470d and 470e to provide a third reference voltage, Vref3.

In an exemplary embodiment, the reference voltages applied are binary coded and the third switches are activated based upon which bit is high so as to not deteriorate the linearity of the ADC. For example, the bottom plates of correction capacitors 435a–c are connected to Vgnd during the sample operation (when Φ1 is active high and first switch 440a is activated). During the hold operation (when φ2 is active high), second switches 445a–c are activated and one of third switches 450a–c is activated so as to shift the bottom plate voltage of the corresponding correction capacitor 435 a–c to a corresponding reference voltage.

Assuming a 10 bit output from the ADC, the largest magnitude of error to be corrected is Ccorr*(Vref3+Vref2+Vref1)/(Csh+3*Ccorr). Obviously, Vref3 is Vdd/2, Vref2 is Vdd/4, and Vref1 is Vdd/8. And also since there are third switches 450a–c between the bottom plate of correction capacitors 435a–c and the reference voltages Vref1–3, the shift amount can be easily controlled by the bits (b10, b9, and b8, e.g.) through these third switches 450a–c. This allows for a higher degree of correction close to full-code. For example, Vcorrection_maximum=Vdd*⅞*Cu/(203Cu)=11.2 mV when b10=b9=b8=1.

Vcorrection_minimum=Vdd*⅛*Cu/(203Cu)=1.6 mV when b10=b9=0 and b8=1.

Figure 5:
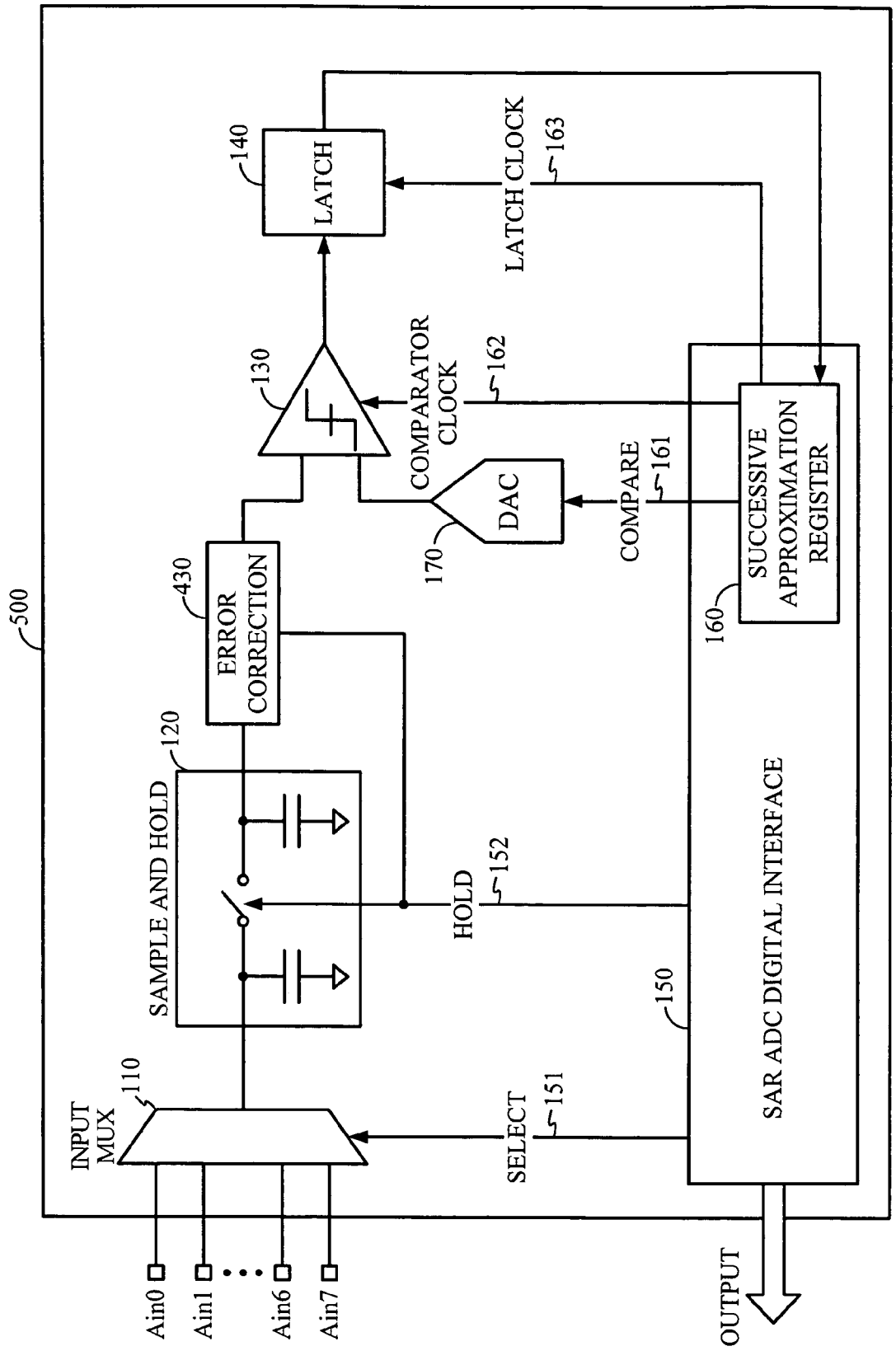
FIG. 5 is diagram illustrating an exemplary embodiment of an ADC having a gain error correction circuit of FIG. 4.

FIG. 5 illustrates an exemplary embodiment of an ADC having an error correction circuit of FIG. 4. Elements of ADC 500 are similar to those of ADC 100 of FIG. 1, however, error correction circuit 430 is included between sample-and-hold circuit 120 and comparator 140.

With the configuration of structure disclosed herein, the systems and methods described herein provides ways to correct gain error within an ADC. As such, the need for gain error correction is obviated.

The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features as defined by the following claims.

What is claimed is:

1. A gain error correction circuit for use with an analog-to-digital converter (ADC) comprising:
   a plurality of correction capacitors arranged in parallel; and
   a plurality of switch arrangements, each of the plurality of switch arrangements being coupled to a respective correction capacitor, each switch arrangement comprising
      a first switch coupled to ground and arranged to be active during a sample phase of the ADC,
      a second switch arranged to be active during a hold phase of the ADC, and
      a third switch coupled to a reference voltage and the second switch and arranged to be active during a particular bit output of the ADC being high;
   wherein the first switch is arranged in parallel with the second and third switches.

2. The gain error correction circuit of claim 1, further comprising:
   a plurality of resistors arranged in series so as to provide a plurality of reference voltages to the plurality of switch arrangements.

3. An analog-to-digital converter (ADC) comprising:
   a sample-and-hold circuit;
   a comparator; and
   a gain error correction circuit coupled to the sample-and-hold circuit and the comparator, the gain error correction circuit comprising
      a plurality of correction capacitors arranged in parallel; and
      a plurality of switch arrangements, each of the plurality of switch arrangements being coupled to a respective correction capacitor, each switch arrangement comprising
         a first switch coupled to ground and arranged to be active during a sample phase of the ADC,
         a second switch arranged to be active during a hold phase of the ADC, and
         a third switch coupled to a reference voltage and the second switch and arranged to be active during a particular bit output of the ADC being high;
      wherein the first switch is arranged in parallel with the second and third switches.

4. The ADC of claim 3, wherein the gain error correction circuit further comprises:
   a plurality of resistors arranged in series so as to provide a plurality of reference voltages to the plurality of switch arrangements.

5. A gain error correction circuit for use with an analog-to-digital converter (ADC) comprising:
   correction capacitance means; and
   switching means coupled to the correction capacitance means, the switching means being coupled to ground and to a plurality of reference voltages and being arranged to couple a bottom plate of the correction capacitance means to ground during a sample phase of the ADC and to one of a plurality of reference voltages during a hold phase of the ADC,
   wherein the one of a plurality of reference voltages is selected based upon an output bit of the ADC being high.

6. An analog-to-digital converter (ADC) comprising:
sample-and-hold means;
means for comparing; and
gain error correction means coupled to the sample-and-hold means and the means for comparing, the error correction means comprising
correction capacitance means; and
switching means coupled to the correction capacitance means, the switching means being coupled to ground and to a plurality of reference voltages and being arranged to couple a bottom plate of the correction capacitance means to ground during a sample phase of the ADC and to one of a plurality of reference voltages during a hold phase of the ADC,
wherein the one of a plurality of reference voltages is selected based upon an output bit of the ADC being high.

* * * * *